(12) United States Patent
Pezeshki et al.

(10) Patent No.: US 11,418,257 B2
(45) Date of Patent: Aug. 16, 2022

(54) HIGH SPEED AND MULTI-CONTACT LEDS FOR DATA COMMUNICATION

(71) Applicant: AvicenaTech Corp., Mountain View, CA (US)

(72) Inventors: Bardia Pezeshki, Sunnyvale, CA (US); Robert Kalman, Sunnyvale, CA (US); Alex Tselikov, Sunnyvale, CA (US)

(73) Assignee: AVICENATECH CORP., Mountain View, CA (US)

( * ) Notice: Subject to any disclaimer, the term of this patent is extended or adjusted under 35 U.S.C. 154(b) by 0 days.

(21) Appl. No.: 16/951,332

(22) Filed: Nov. 18, 2020

(65) Prior Publication Data

US 2021/0151623 A1     May 20, 2021

Related U.S. Application Data

(60) Provisional application No. 62/971,844, filed on Feb. 7, 2020, provisional application No. 62/936,767, filed on Nov. 18, 2019.

(51) Int. Cl.
*H04B 10/00* (2013.01)
*H04B 10/116* (2013.01)
(Continued)

(52) U.S. Cl.
CPC ........ *H04B 10/116* (2013.01); *H01L 33/0008* (2013.01); *H01L 33/0016* (2013.01);
(Continued)

(58) Field of Classification Search
CPC .... H04B 10/116; H04B 10/40; H04B 10/502; H04B 10/112; H04B 10/1123;
(Continued)

(56) References Cited

U.S. PATENT DOCUMENTS 5,003,366 A     3/1991  Mishima et al.
5,818,984 A *  10/1998  Ahmad ............... H04B 10/803
                                                                  385/14
(Continued)

FOREIGN PATENT DOCUMENTS

CN      102130221 A     7/2011
CN      106159047 A    11/2016
CN      110190083 A     8/2019

OTHER PUBLICATIONS

Carlos Medina et al., LED Based Visible Light Communication: Technology, Applications and Challenges—A Survey, International Journal of Advances in Engineering & Technology, vol. 8, Issue 4, pp. 482-495, Aug. 31, 2015, [retrieved on Feb. 23, 2020], Retrieved from <Researchgate, https://www.researchgate.net/publication/281408421> <doi:10.7323/ijaet/v8_iss4>.

(Continued)

*Primary Examiner* — Hanh Phan
(74) *Attorney, Agent, or Firm* — Klein, O'Neill & Singh, LLP

(57) ABSTRACT

An LED may include a third contact, for example to increase speed of operation of the LED. The LED with the third contact may be used in an optical communication system, for example a chip-to-chip optical interconnect.

6 Claims, 5 Drawing Sheets

(51) Int. Cl.
  *H01L 33/04* (2010.01)
  *H01L 33/32* (2010.01)
  *H01L 33/00* (2010.01)
  *H01L 33/58* (2010.01)
  *H01L 33/06* (2010.01)
  *H04B 10/50* (2013.01)

(52) U.S. Cl.
  CPC .............. *H01L 33/04* (2013.01); *H01L 33/06* (2013.01); *H01L 33/32* (2013.01); *H01L 33/58* (2013.01); *H04B 10/502* (2013.01)

(58) Field of Classification Search
  CPC .............. H04B 10/114; H04B 10/1143; H04B 10/1149; H01L 33/06; H01L 33/32; H01L 33/0008; H01L 33/04; H01L 33/0016
  USPC ....... 398/172, 118, 119, 128, 130, 135, 136, 398/137, 138, 139, 82, 79, 182, 183, 186, 398/158, 159, 164; 385/24, 129, 124
  See application file for complete search history.

(56) References Cited

U.S. PATENT DOCUMENTS

| | | |
|---|---|---|
| 7,961,990 B2 * | 6/2011 | Krishnamoorthy .......................... H01L 25/0657 385/14 |
| 10,002,928 B1 | 6/2018 | Raring et al. |
| 2014/0001483 A1 | 1/2014 | Rand et al. |
| 2015/0243648 A1 | 8/2015 | Edwards |
| 2015/0349200 A1 | 12/2015 | Chen et al. |
| 2020/0135968 A1 * | 4/2020 | Daami ................ H01L 33/0025 |
| 2021/0152244 A1 * | 5/2021 | Pezeshki ............. H01L 33/0008 |

OTHER PUBLICATIONS

International Search Reporton related PCT Application No. PCT/US2020/061101 from International Searching Authority (KIPO) dated Mar. 11, 2021.

Written Opinion on related PCT Application No. PCT/US2020/061101 from International Searching Authority (KIPO) dated Mar. 11, 2021.

M. Feng et al., Light-emitting transistor: Light emission from InGaP/GaAs heterojunction bipolar transistors, Applied Physics Letters, vol. 84, No. 1, Jan. 5, 2004, pp. 151-153.

M. Feng et al., Quantum-well-base heterojunction bipolar light-emitting transistor, Applied Physics Letters, vol. 84, No. 11, Mar. 15, 2004, pp. 1952-1954.

International Search Reporton PCT Application No. PCT/US2020/061076 from International Searching Authority (KIPO) dated Mar. 12, 2021.

Written Opinion on PCT Application No. PCT/US2020/061076 from International Searching Authority (KIPO) dated Mar. 12, 2021.

Kioupakis et al., Interplay of Polarization Fields and Auger Recombination in the Efficiency Droop of Nitride Light-Emitting Diodes, Applied Physics Letter, 101, 231107, Dec. 5, 2012, Retrieved from <http://dx.doi.org/10.1063/1.4769374>.

* cited by examiner

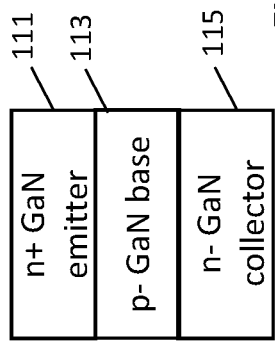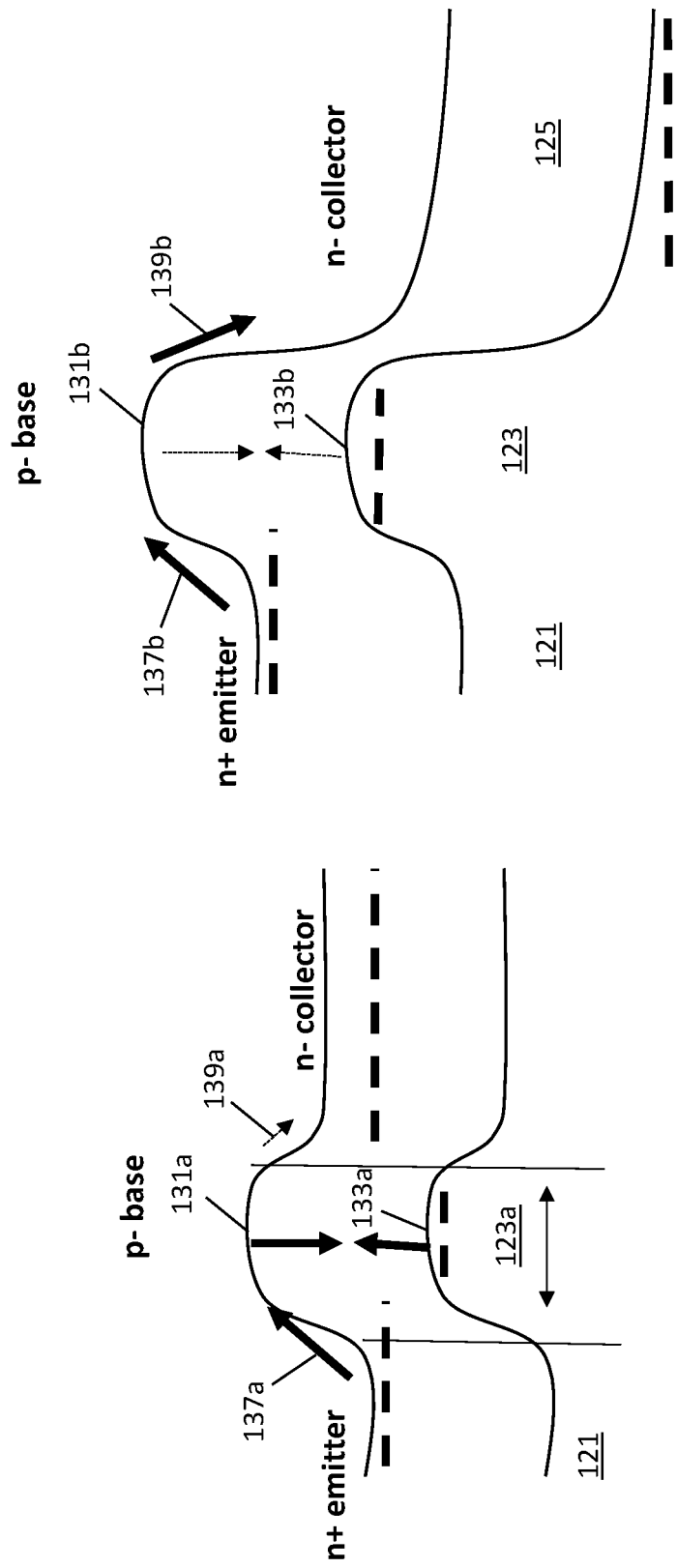

HIGH SPEED AND MULTI-CONTACT LEDS FOR DATA COMMUNICATION

CROSS REFERENCE TO RELATED APPLICATION

This application claims the benefit of the filing date of U.S. Provisional Patent Application No. 62/936,767, filed on Nov. 18, 2019, and U.S. Provisional Patent Application No. 62/971,844, filed on Feb. 7, 2020, the disclosures of which are incorporated by reference herein.

FIELD OF THE INVENTION

The present invention relates generally to light emitting diodes (LEDs), and more particularly to high speed LEDs for data communications.

BACKGROUND OF THE INVENTION

Lasers tend to dominate optical communications on account of their narrow linewidth, single spatial mode output, and high-speed characteristics. The narrow linewidth of a laser means that high speed signals can pass through dispersive mediums for long distances without pulse broadening. Long distance fiber optic links are frequently limited by chromatic dispersion and thus a narrow linewidth laser may be essential for long distance fiber optic links. The single spatial mode of a laser is also relatively easy to couple to single mode fiber.

The stimulated emission of lasers may also allow for high modulation speeds. Directly modulated optical links may be able to run at 25 Gb/s easily, and potentially carry 50 Gb/s of information using PAM4 modulation.

However, use of lasers may present difficulties for optical communications for very short distances, such as chip-to-chip communications.

BRIEF SUMMARY OF THE INVENTION

In some embodiments an optical communication system for communicating information provided by a processor to another area of the processor or another module in a multi-chip module, comprises: an LED associated with the processor; an LED driver for activating the LED to generate light based on data provided to the LED driver from the processor; a detector for performing optical-electrical conversion using the light; and an optical waveguide optically coupling the LED and the detector; wherein the LED comprises: a bipolar junction transistor (BJT) with a base including quantum wells. In some embodiments an emitter of the BJT comprises AlGaN.

In some embodiments an optical communication system for communicating information provided by a processor to another area of the processor or another module in a multi-chip module, comprises: an LED associated with the processor; an LED driver to modulate the output optical power of the LED, such that the LED will generate light based on data provided to the LED driver from the processor; a detector for performing optical-electrical conversion using the light, the detector for example having an electrical output that is modulated by optical power incident on the detector; and an optical waveguide optically coupling the LED and the detector; wherein the LED comprises: a p-n junction with a metal oxide semiconductor (MOS) structure.

These and other aspects of the invention are more fully comprehended upon review of this disclosure.

BRIEF DESCRIPTION OF THE FIGURES

FIG. 1A shows an electrically controllable LED fabricated with an extra contact, in accordance with aspects of the invention, FIG. 1B shows a band diagram for an on state of the LED, and FIG. 1C shows a band diagram for an off state of the LED.

DETAILED DESCRIPTION

Figure 2:
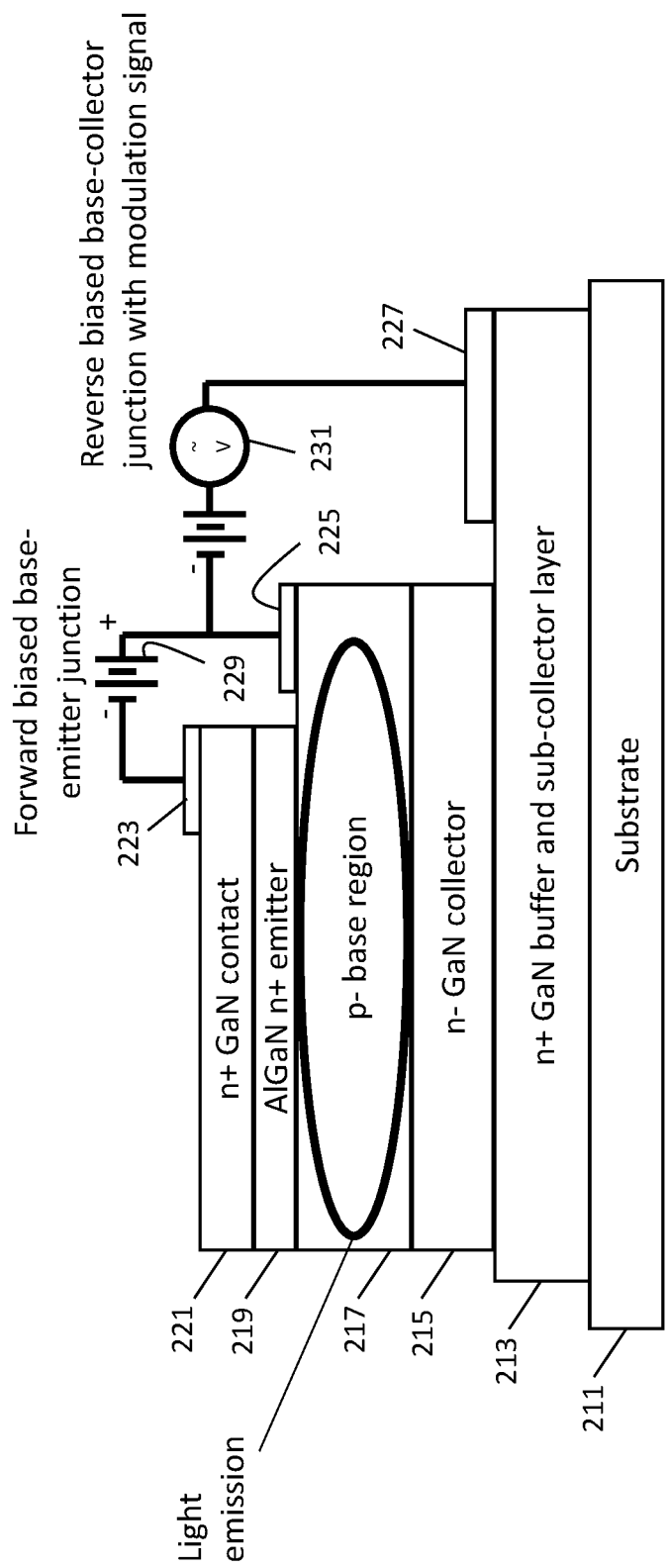
FIG. 2 shows an electrically controllable LED fabricated with an extra contact, with an AlGaN emitter, in accordance with aspects of the invention.

The characteristics of lasers may not be as important for optical communications for very short distances, such as chip-to-chip communications. In some embodiments microLEDs, especially structures optimized for high modulation speeds, are used for coupling light into waveguides, for example as discussed with respect to FIG. 5. In some embodiments use of the microLEDs provide highly parallel communications between chips, for example on an interposer or through a 3D optical structure, for example an optical structure that includes optical waveguides and/or free-space optical propagation with optical elements such as lenses and holograms. GaN based microLEDs have been developed for display applications and a packaging ecosystem has been developed for mounting such devices on silicon CMOS or polysilicon-on-glass backplanes. With relatively minor modifications, elements of such a packaging eco-system may be used to interconnect ICs for chip-to-chip communications.

In some embodiments a microLED is distinguished from a semiconductor laser (SL) as follows: (1) a microLED does not have an optical resonator structure; (2) the optical output from a microLED is almost completely spontaneous emission, whereas the output from a SL is dominantly stimulated emission; (3) the optical output from a microLED is temporally and spatially incoherent, whereas the output from a SL has significant temporal and spatial coherence; (4) a microLED is designed to be driven down to a zero minimum current, whereas a SL is designed to be driven down to a minimum threshold current, which is typically at least 1 mA. In some embodiments a microLED is distinguished from a standard LED by (1) having an emitting region of less than 100 micrometers by 100 micrometers (less than 100 um×100 um in some embodiments); (2) frequently having positive and negative contacts on top and bottom surfaces, whereas a standard LED typically has both positive and negative contacts on a single surface; (3) typically being used in large arrays for display and interconnect applications.

In some embodiments, for chip to chip communications, the distances are so short that chromatic dispersion is not necessarily a problem. Simple calculations indicate that, for a GaN LED with a center wavelength in the range of 400 nm-450 nm and a 20 nm spectral width, if the LED is modulated at 4 Gb/s and propagates through a doped $SiO_2$ waveguide or fiber, the waveguide or fiber can be up to 5 meters long with a dispersion power penalty less than 2 dB. Since chip to chip communication distances within a multichip module (MCM) or across a PC board are typically less than tens of centimeters, the broad spectral width of an LED may not be an issue. Furthermore, one can even use highly multi-moded waveguides into which it is relatively easy to couple the output light from an LED. Since the distances are short, modal dispersion of multimode waveguides may again not be an issue. At a 4 Gb/s signal rate, even in a waveguide with a 10% core-cladding index step that has an NA of 0.67, the waveguide length can be up to 85 cm with a small dispersion power penalty; smaller core-cladding index steps generally have longer reach. So broad spectrum LEDs and multi-mode waveguides are adequate in many embodiments for chip to chip communications.

Furthermore, in various embodiments the microLEDs are fabricated at very small sizes, with device dimensions of less than 2 um. Such a small mode has very high intrinsic brightness (i.e. low etendue) and generally can be easily coupled to a multimode waveguide. Though the output is generally Lambertian, with proper use of reflectors, microlenses in some embodiments, and imbedding the microLED in waveguide in some embodiments, coupling efficiencies can be 30% or more. MicroLEDs typically have high quantum efficiencies, similar or even surpassing lasers. Since over short distances one does not suffer much loss, even at the blue or green wavelengths, not much transmit power is required and a small microLED can be sufficient, running at a 10 uA or so in some embodiments.

A microLED in general is limited by the carrier lifetime (and by capacitance if the microLED is too big), and generally cannot achieve the modulation speeds of highspeed lasers. However, clock speeds in microprocessors and logic seem to be reaching a limit of a few Gb/s and data coming in and out of ICs are typically sped up using serializer/deserializers (SERDES) to produce a smaller number of higher speed lanes. For example, commercially available switch ICs may currently run at a few GHz clock speed, but communicate with 256 or 512 lanes of 50 Gb/s or 100 Gb/s per lane, where each lane has an associated SERDES. These SERDES consume a great deal of electrical power and can be eliminated if the switch IC instead uses a larger number of lower speed lanes. Optics allows that parallelism and would enable much higher throughput, even at slower lane speeds by having a much larger number of lanes. Nevertheless, LEDs that operate at modulation speeds that are as high as possible may be preferred.

Furthermore, GaN microLEDs have substantial advantages over lasers in that they do not have a significant threshold current. Though quantum efficiency is a function of drive current, there is not a discrete threshold level for microLEDs, and moreover, microLEDs can be run at far lower currents than lasers. Given their usefulness for displays, there is a substantial infrastructure for mounting, connecting, and testing microLEDs on various substrates. And GaN microLEDs generally have far superior high temperature performance and reliability over semiconductor lasers.

Typically, a GaN microLED, optimized for display applications, comprises a cylindrical or cylindrical-like structure with a p-i-n doping profile. The LED is turned on by forward biasing the diode and injecting electrons from the n-region and holes from the p-region into the middle intrinsic region that contains InGaN quantum wells. A p contact is on one side of the structure, while an n contact is on the other. In many applications the device is mounted onto a chip, where a "bottom" side electrically contacts the chip, and a "top" side contacts a common lead (e.g. a ground or power lead). The top side contact may be a transparent conductor such as indium-tin oxide (ITO). In microLEDs the vertical structure is often preferred, but there are also lateral structures, or an n-contact that is adjacent to the p-contact. In any case, this structure is not optimized for speed, simply because displays typically run at 60 Hz or 120 Hz frame rate, not at Gb/s.

There are changes that one can do to optimize the structure for speed. In general, a microLED is limited by the capacitance of the LED and the carrier recombination time (or diffusion capacitance). The capacitance forms an RC circuit with the drive output impedance and causes a roll-off at high frequencies. The carrier lifetime means that the LED takes time to turn off, as one has to wait for the minority injected carriers to recombine for the light emission to cease, even after the electrical pulse has ended. Due to their small size, the capacitance of microLEDs, generally just a few femto-Farads, does not significantly limit device modulation speed; rather, modulation speed is generally limited by carrier lifetime.

Generally the speed of a microLED increases with injected current density. There are three ways that carriers can recombine in LEDs. At low current levels, the recombination is mediated by traps (SRH recombination). At higher current densities these traps become saturated and the quantum efficiency of the LED improves, as radiative recombination dominates. This radiative recombination rate speeds up as the carrier density increases, increasing the radiative efficiency and reducing the carrier lifetime. Thus the harder (e.g. greater current densities) the microLEDs are driven, the faster they operate. At high current densities, nonlinear non-radiative mechanisms such as Auger recombination further reduce carrier lifetime, but these non-radiative mechanisms also reduce the radiative quantum efficiency. For a fast microLED with a small diameter driven with a high current density, the traps are relatively unimportant as they are saturated, and the relative significance of nonlinear non-radiative versus radiative recombination rate determines the quantum efficiency.

There are structural changes that can be made to a microLED to improve speed. In some embodiments an electrically controllable LED is fabricated with an extra contact. One possible configuration is to have the light emission occur in the base of an LED that is in the general form of a bipolar junction transistor, which has base, emitter, and collector regions, each with an associated electrical contact. The base-emitter junction may be forward biased with the emitter injecting carriers into the base and recombining so that light is emitted from the base region. For light emission, the transistor may be biased into saturation, with the collector unbiased. To turn the LED off rapidly, the collector is reverse biased, sweeping the minority carriers out of the base. FIG. 1A shows this structure, along with band diagrams for an on state and an off state in FIGS. 1B and 1C, respectively.

As shown in FIG. 1A, in some embodiments an LED includes an n+ GaN emitter 111 and an n− GaN collector. A p− GaN base region 113 is between the emitter and the collector. The base region includes quantum wells.

The band diagram of FIG. 1B is for the LED of FIG. 1A in the on state. The band diagram of FIG. 1B shows a conduction band 131a above a valence band 133a. The bands extend across an emitter region 121, a base region 123, respectively, and a collector region 125. A bandgap between the conduction band and the valence band is generally constant across each region, with energy levels generally increasing in the recombination region between the emitter and base regions, and energy levels dropping somewhat in the collector region. In the "on" state, electrons are injected 137a from the emitter region into the base region where most of them recombine; the remaining electrons that have not recombined are swept out 139a from the base region into the collector region, as indicated by the relative size of arrows in FIG. 1B.

The band diagram of FIG. 1C is for the LED of FIG. 1A in the "off" state. As with the band diagram of FIG. 1B, the band diagram of FIG. 1C shows a conduction band 131b above a valence band 133b, extending across the emitter region 121, the base region 123, and the collector region 125. In the "off" state, electrons are injected 137b from the emitter region into the base region. Unlike in the "on" state, however, in the "off" state a significant fraction of electrons are swept out 139b from the base region into the collector region, again as indicated by the relative size of arrows in FIG. 1C.

A further enhancement would be to have the emitter region made from AlGaN for better injection into the base region. In some embodiments the AlGaN acts as a barrier on the n region to further enhance injection of carriers into the p doped base region and prevent hole injection into the n type region. In 3D the structure may be in the form shown in the schematic cross-section of FIG. 2.

FIG. 2 shows an n+ GaN buffer and sub-collector layer 213 on top of a substrate 211. The substrate could be silicon, GaN, or most commonly used, sapphire. An n− GaN collector layer 215 is on top of a first portion of the sub-collector layer, while a collector electrical contact 227 is on top of a second portion of the sub-collector layer. A p− base region layer 217 is on top of the collector layer. In many embodiments the p− base region layer includes one or more quantum wells. In operation, light may be emitted by the base region layer. An AlGaN n+ emitter layer 219 is on top of a first portion of the base region layer, while a base electrical contact 229 is on top of a second portion of the base layer. The AlGaN n+ emitter layer separates the base region layer and a n+ GaN contact layer 221, which is on top of the AlGaN n+ emitter layer. An emitter electrical contact 223 is on top of a portion of the n+ GaN contact layer.

The base-emitter junction can be forward biased through application of a voltage 229, injecting holes into the base. But the electron concentration in the base would be controlled by the base-collector voltage, where a negative bias would sweep out the carriers. Thus the base-collector junction would be reverse biased and a modulation signal 231 applied. This structure would be much faster than an LED since the turn-off time is no longer limited by the intrinsic carrier lifetime, but is instead determined by the speed with which the electric field in the base-collector removes carriers from the base region. However, this speed-up may come at the cost of reduced quantum efficiency because carriers that are removed from the base region cannot recombine to generate photons.

Figure 3:
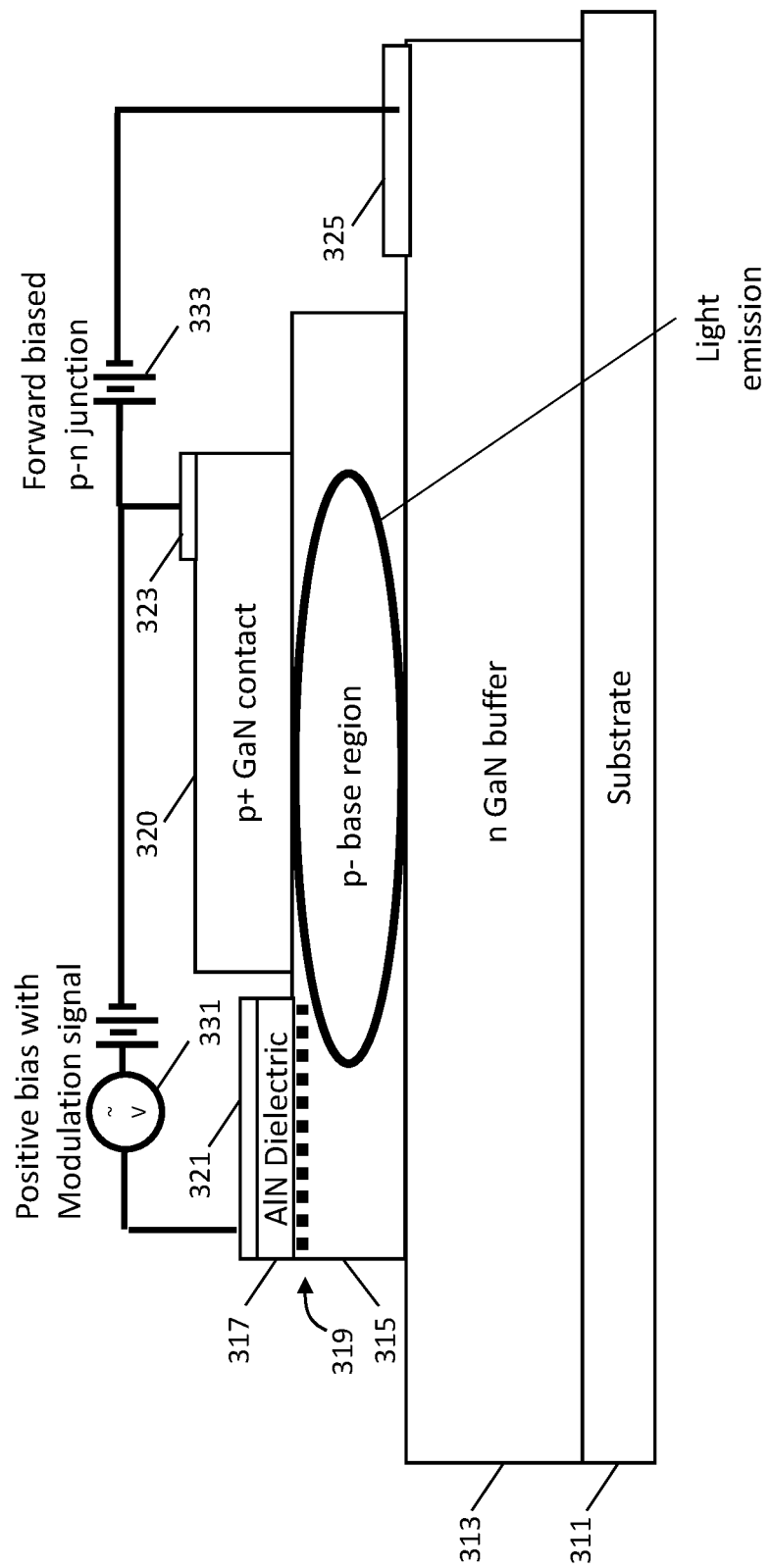
FIG. 3 shows an LED structure with an extra contact, that combines a p-n junction with a MOS structure that can sweep out the minority carriers, but collect them in an accumulation region, in accordance with aspects of the invention.

An alternative structure is to combine a p-n junction with a MOS structure that can sweep the minority carriers from the base into an accumulation region. Laterally, the structure may be in form shown in the schematic cross-section of FIG. 3, if fabricated on a planar surface. In FIG. 3, an n type GaN buffer layer 313 is shown on a substrate 311. A p− base region layer 325 is on top of a first portion of the n type GaN layer, with an electrical contact 325 on top of a second portion of the n type GaN layer The n type GaN (with potentially an AlGaN barrier layer between it and the base layer in some embodiments) would inject electrons into a p− base region. These minority electrons would recombine in the base region with the local hole population to generate light.

A p+ GaN contact layer is on top of a first portion of the p− base region layer and a metal-oxide-semiconductor (MOS) structure, provided by a dielectric, for example aluminum nitride (AlN) 317, with an electrical contact 321 on top, is on top of a second portion of the p− base region layer. The MOS structure is close to the recombination region where a positive bias on the gate would pull the injected carriers into an accumulation region 319 under the MOS dielectric and turn off the light emission. Removing this voltage or making it slightly negative would force the carriers back into the base region where the carriers would recombine and give off light. Thus the injected electrons are not removed from the system, but are instead "recycled" for greater quantum efficiency compared to a transistor structure.

The structure in FIG. 3 generally has the accumulation region close to the base region, as the modulation speed of the device is related to the speed with which carriers can be swept between the two regions. In fact, the response time generally may depend on the size of the separation distance of the base and accumulation regions, and on the electric field (mobility) or saturation velocity, $v_{sat}$. In GaN, the saturation velocity of electrons is $1.4 \times 10^7$ cm/s, so one may use a spacing of <10 um to achieve at least a 4 GHz modulation speed. This is easily achievable with a microLED diameter in the range of 2 um.

Figure 4:
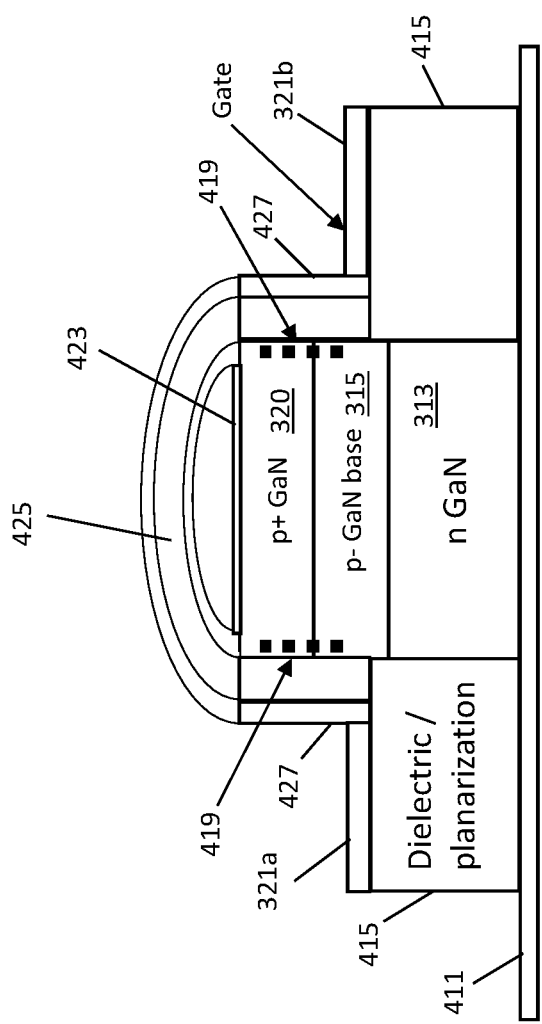
FIG. 4 shows an LED structure with an extra contact, that includes a lateral accumulation region, in accordance with aspects of the invention.

FIG. 4 shows an alternate MOS device geometry, where the MOS dielectric layer 425 is formed around the circumference of the microLED and can result in higher speeds. In the schematic the LED is bonded to a metal base 411 that provides an n− contact. An n GaN buffer layer 313 is on the metal base. An insulating layer 415, also bonded to the metal base, is on at least opposing sides of the buffer layer. The insulating layer extends slightly above a top of the buffer layer, on which may be found a p− GaN base region layer 315. A p+ GaN layer 320 is on top of the base layer. A p contact 423, for example a transparent p contact, is on top of the p+ GaN layer. The MOS dielectic layer is formed around the sides of the base region layer, and also around sides of the p+ GaN layer, with metallization 427 around the outward sides of the MOS dielectric layer. Accumulation regions 419 are in parts of the base region adjacent to the AlN. The insulating layer 415 serves as a stop from placement, for example by deposition, of the MOS dielectric and metallization about the n GaN buffer layer. The lateral deposition of dielectric and metallization around the sides may be considered to act as the MOS structure.

Figure 5:
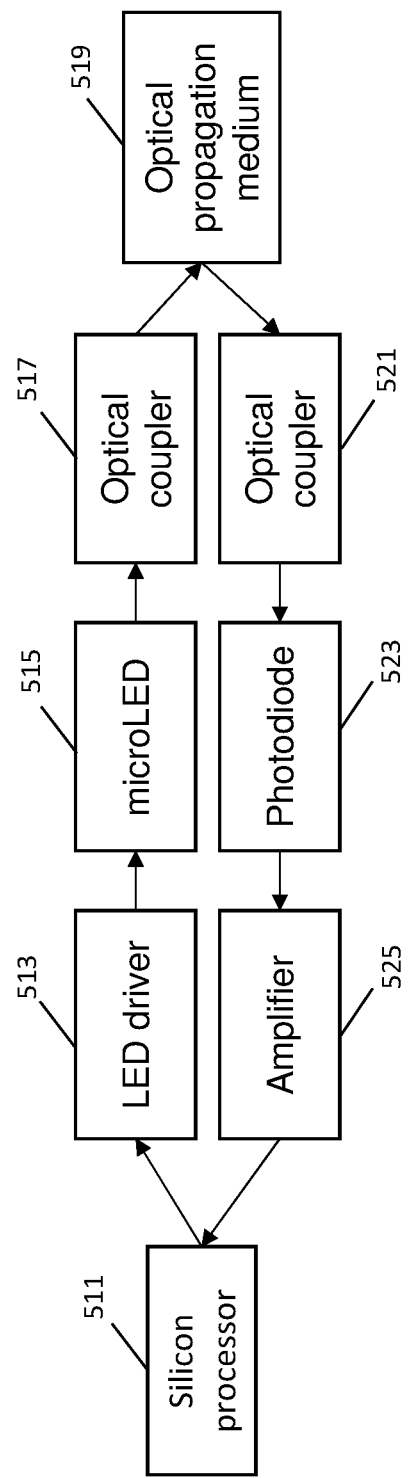
FIG. 5 shows an example of use of a LED as variously discussed herein, in accordance with aspects of the invention.

FIG. 5 shows an example of use of an LED, which may be a microLED 515, as variously discussed herein. In FIG. 5, a silicon processor 511 performs various operations on or with data. For example, the silicon processor may perform calculations on data, may perform switching functions, or may perform other functions. The silicon processor provides at least some of the data to an LED driver 513, with the LED driver activating the microLED to generate light with a power level that is modulated by at least some of the data. The generated light is provided to an optical coupler 517, which passes the light into an optical propagation medium 519. The optical propagation medium, which may be for example a waveguide, may be used to transfer the light from one area of the silicon processor to another area of the silicon processor in some embodiments. In other embodiments, the optical propagation medium may be used to transfer light from the silicon processor to another silicon processor, or memory, or other module, for example in a multi-chip module (not shown in FIG. 5). The optical propagation medium may transfer the light to another optical coupler 521, which in turn passes the light to a detector 523, for example a photodiode, for optical-electrical conversion. The electrical signal from the detector output, including the at least some of the data, may be amplified by an amplifier 525, and provided to the silicon processor (or other chip in a multi-chip module). In some embodiments the microLEDs and detectors can be coupled to waveguides individually, and/or in some embodiments they may be coupled in parallel as arrays. The optical waveguides, in addition to transferring the light and the data from one position to another could also split the light into two or more outputs, allowing data fanout. The optical waveguides or medium could also perform some switching directing the output from one receiver to another receiver.

The microLEDs and detectors can be coupled to waveguides either individually or in parallel as arrays.

Although the invention has been discussed with respect to various embodiments, it should be recognized that the invention comprises the novel and non-obvious claims supported by this disclosure.

What is claimed is:

1. An optical communication system for communicating information provided by a processor to another area of the processor or another chip in a multi-chip module, comprising:
   an LED associated with the processor;
   an LED driver for activating the LED to generate light that is modulated based on data provided to the LED driver from the processor;
   a detector for performing optical-electrical conversion using the light; and
   an optical waveguide optically coupling the LED and the detector;
   wherein the LED comprises:
      a bipolar junction transistor (BJT) with a base that includes quantum wells,
   wherein the BJT with a base including quantum wells comprises:
   an n+GaN buffer and sub-collector layer on a substrate;
   an n−GaN collector layer on the GaN buffer and sub-collector layer;
   the base being on the n−GaN collector layer, the base having a p-doping;
   an AlGaN n+emitter layer on the base; and
   an n−GaN contact layer.

2. The system of claim 1, further comprising:
   a further LED associated with the other area of the processor or other chip in the multi-chip module;
   a further LED driver for activating the further LED to generate light that is modulated based on data provided to the further LED driver from the further area of the processor or other chip in the multi-chip module; and
   a further detector for performing optical-electrical conversion using the light from the further LED;
   wherein the further LED comprises:
      a further bipolar junction transistor (BJT) with a further base that includes further quantum wells;
   wherein the further BJT with a further base including further quantum wells comprises:
   a further n+GaN buffer and sub-collector layer on a substrate;
   a further n−GaN collector layer on the further GaN buffer and sub-collector layer;
   the further base being on the further n−GaN collector layer, the further base having a p-doping;
   a further AlGaN n+emitter layer on the base; and
   a further n−GaN contact layer.

3. An optical communication system for communicating information provided by a processor to another area of the processor or another module in a multi-chip module, comprising:
   an LED associated with the processor;
   an LED driver for activating the LED to generate light that is modulated based on data provided to the LED driver from the processor;
   a detector for performing optical-electrical conversion using the light; and
   an optical waveguide optically coupling the LED and the detector;
   wherein the LED comprises:
   a p-n junction with a metal oxide semiconductor (MOS) structure, wherein the p-n junction with a MOS structure comprises:
   a n doped GaN buffer layer;
   a p−base layer on at least a portion of the n doped GaN buffer layer;
   a p+GaN contact layer on a first portion of the p−base layer;
   a dielectric layer in contact with a second portion of the p−base layer; and
   a metal layer in contact with the dielectric layer.

4. The system of claim 3, wherein the dielectric layer is on a second portion of the p−base layer.

5. The system of claim 3, wherein the second portion of the p−base layer is on at least one side of the p−base layer.

6. The system of claim 3, further comprising:
   a further LED associated with the other area of the processor or other chip in the multi-chip module;
   a further LED driver for activating the further LED to generate light that is modulated based on data provided to the further LED driver from the further area of the processor or other chip in the multi-chip module; and
   a further detector for performing optical-electrical conversion using the light from the further LED;
   wherein the further LED comprises:
      a further p-n junction with a further metal oxide semiconductor (MOS) structure, wherein the further p-n junction with a further MOS structure comprises:
      a further n doped GaN buffer layer;
      a further p−base layer on at least a portion of the further n doped GaN buffer layer;
      a further p+GaN contact layer on a first portion of further the p−base layer;
      a further dielectric layer in contact with a second portion of the further p−base layer; and
      a further metal layer in contact with the further dielectric layer.

* * * * *